United States Patent
Chen et al.

(10) Patent No.: US 11,942,532 B2
(45) Date of Patent: Mar. 26, 2024

(54) FIN FIELD-EFFECT TRANSISTOR AND METHOD OF FORMING THE SAME

(71) Applicant: Taiwan Semiconductor Manufacturing Company, Ltd., Hsinchu (TW)

(72) Inventors: Chao-Hsuan Chen, Hsinchu (TW); Ming-Chia Tai, Zhubei (TW); Yu-Hsien Lin, Kaohsiung (TW); Shun-Hui Yang, Jungli (TW); Ryan Chia-Jen Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 277 days.

(21) Appl. No.: 17/461,135

(22) Filed: Aug. 30, 2021

(65) Prior Publication Data
US 2023/0062257 A1    Mar. 2, 2023

(51) Int. Cl.
*H01L 29/66* (2006.01)
*H01L 21/28* (2006.01)
*H01L 29/49* (2006.01)
*H01L 29/78* (2006.01)

(52) U.S. Cl.
CPC .. *H01L 29/66795* (2013.01); *H01L 21/28088* (2013.01); *H01L 29/4966* (2013.01); *H01L 29/66545* (2013.01); *H01L 29/7851* (2013.01)

(58) Field of Classification Search
CPC ......... H01L 29/66795; H01L 21/28088; H01L 29/4966; H01L 29/66545; H01L 29/7851; H01L 29/6656; H01L 29/6653
See application file for complete search history.

(56) References Cited

U.S. PATENT DOCUMENTS

| | | | | |
|---|---|---|---|---|
| 6,645,851 B1 * | 11/2003 | Ho | ....... | H01L 21/0273 438/626 |
| RE41,697 E * | 9/2010 | Ho | ....... | G03F 7/0035 438/626 |
| 9,443,741 B1 * | 9/2016 | Su | ....... | H01L 21/0271 |
| 11,022,886 B2 * | 6/2021 | Weng | ....... | H01L 21/31055 |
| 11,289,332 B2 * | 3/2022 | Huang | ....... | H01L 21/76843 |
| 2004/0191930 A1 * | 9/2004 | Son | ....... | H01L 21/31053 257/E21.244 |
| 2007/0200241 A1 * | 8/2007 | Wu | ....... | H01L 23/528 257/E23.151 |
| 2012/0028468 A1 * | 2/2012 | Cheng | ....... | H01L 21/32137 438/694 |
| 2014/0252428 A1 * | 9/2014 | Chang | ....... | H01L 21/76224 257/288 |
| 2014/0284723 A1 * | 9/2014 | Lee | ....... | H01L 29/0649 257/369 |

(Continued)

*Primary Examiner* — Earl N Taylor
(74) *Attorney, Agent, or Firm* — FOLEY & LARDNER LLP

(57) ABSTRACT

A method includes fabricating a semiconductor device, wherein the method includes depositing a coating layer on a first region and a second region under a loading condition such that a height of the coating layer in the first region is greater than a height of the coating layer in the second region. The method also includes applying processing gas to the coating layer to remove an upper portion of the coating layer such that a height of the coating layer in the first region is a same as a height of the coating layer in the second region.

20 Claims, 20 Drawing Sheets

(56) References Cited

U.S. PATENT DOCUMENTS

| | | | |
|---|---|---|---|
| 2018/0033740 A1* | 2/2018 | Kuan | H01L 29/7851 |
| 2018/0337036 A1* | 11/2018 | Weng | H01L 21/02118 |
| 2019/0148145 A1* | 5/2019 | Huang | H01L 21/31056 |
| | | | 438/694 |
| 2021/0159325 A1* | 5/2021 | Hsu | H01L 29/401 |
| 2022/0012400 A1* | 1/2022 | Liu | G06F 30/392 |
| 2022/0230926 A1* | 7/2022 | Huang | H01L 27/0886 |
| 2023/0223349 A1* | 7/2023 | Guo | H01L 21/0332 |
| | | | 257/797 |

\* cited by examiner

FIN FIELD-EFFECT TRANSISTOR AND METHOD OF FORMING THE SAME

BACKGROUND

The present disclosure generally relates to semiconductor devices, and particularly to methods of making a non-planar transistor.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a fin protruding from a substrate. A gate structure, configured to control the flow of charge carriers within a conductive channel of the FinFET device, wraps around the fin. For example, in a tri-gate FinFET device, the gate structure wraps around three sides of the fin, thereby forming conductive channels on three sides of the fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
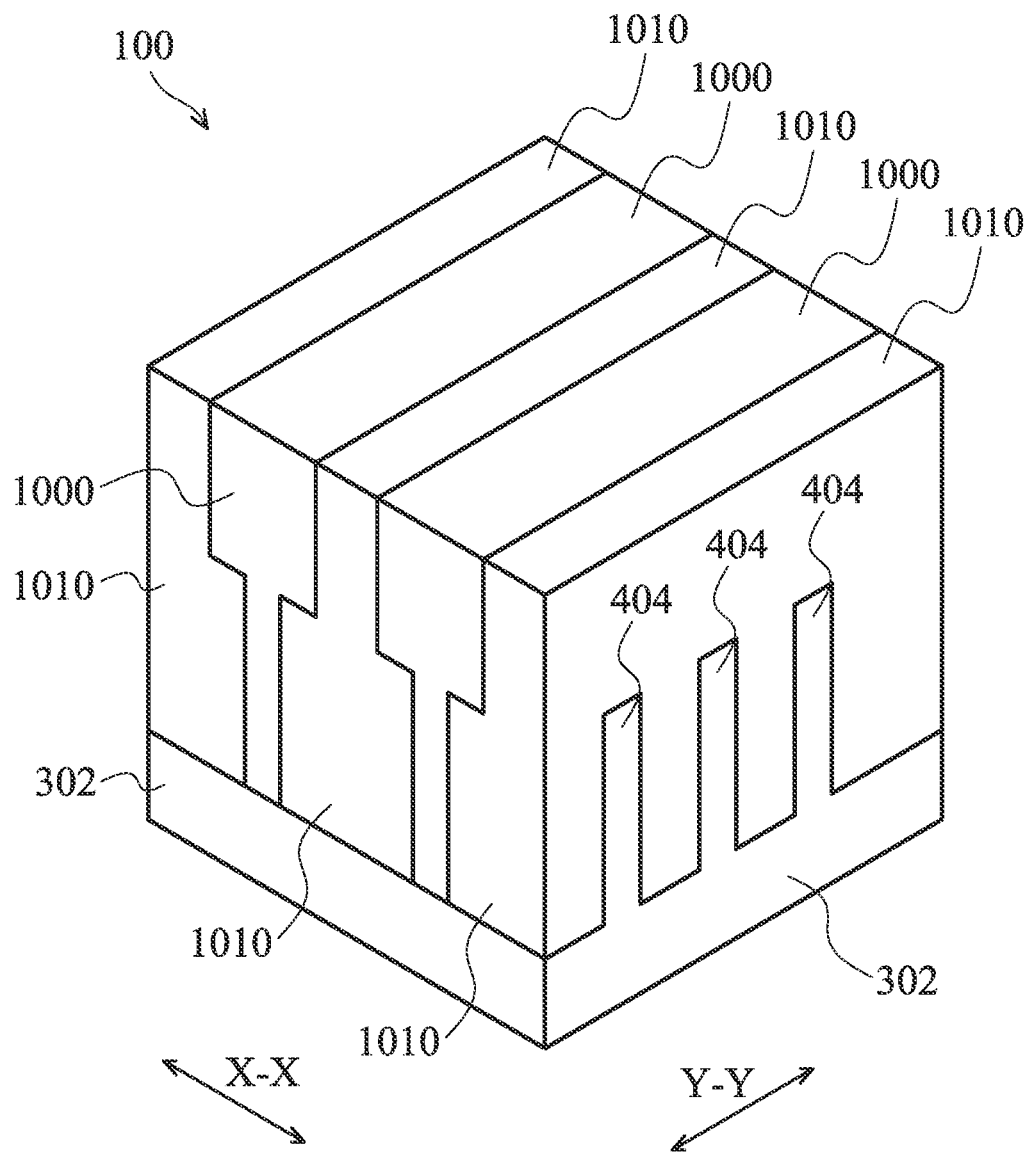
FIG. 1 illustrates a perspective view of a semiconductor device, a fin field-effect transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a semiconductor device. In some embodiments, a coating layer is deposited on a first region and a second region. The coating layer is deposited under a loading condition such that a height of the coating layer in the first region is greater than a height of the coating layer in the second region. Processing gas is applied to the coating layer to remove an upper portion of the coating layer such that a height of the coating layer in the first region is a same as a height of the coating layer in the second region.

Depositing a coating layer over regions of a semiconductor device can cause loading, where the height of the coating layer depends on the density of underlying structures in different regions of the device. Loading contributes to lower device yields, increased defect counts, leakages, and damage to device sublayers, and in the case of FinFET devices, fin top damage. Applying a processing gas to the coating layer such that a height of the coating layer is the same different regions of the device eliminates loading problems, thus reducing device defects and sublayer damage, and increasing yield.

FIG. 1 illustrates a perspective view of an example semiconductor device 100, in accordance with various embodiments. FIG. 1 is provided as a reference to illustrate a number of cross-sections in subsequent figures. For example, cross-section Y-Y extends along a longitudinal axis of the trench 1000. Cross-section X-X is perpendicular to cross-section Y-Y and is along a longitudinal axis of the fins 404. A long axis of the interlevel dielectric structures 1010 extends along the Y-Y direction. The fins 404 also extend upward from the substrate 302. Subsequent figures refer to these reference cross-sections for clarity.

Figure 2A:
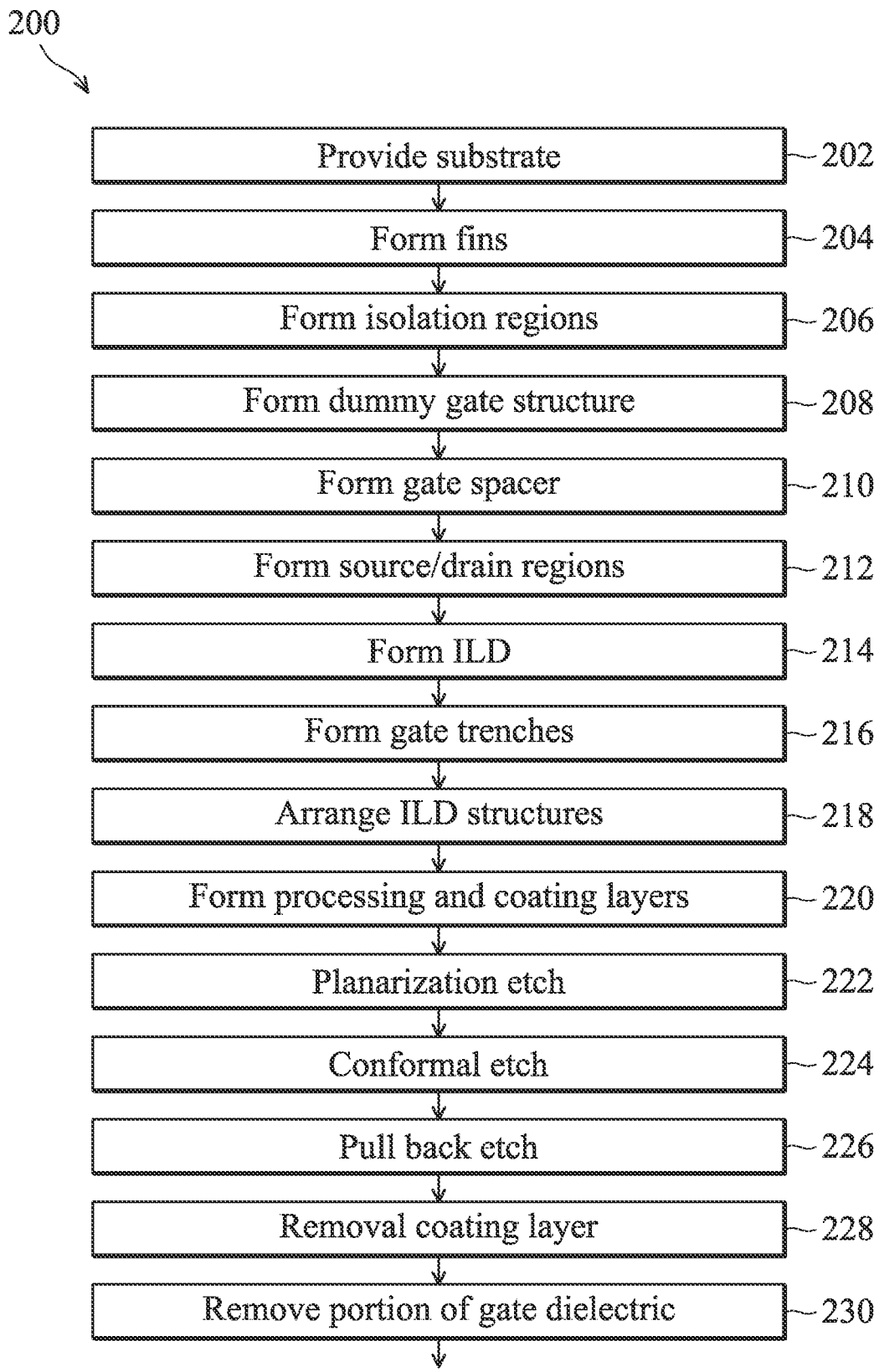
FIGS. 2A and 2B illustrate a flow chart of an example method for making a semiconductor device, in accordance with some embodiments.
Figure 2B:
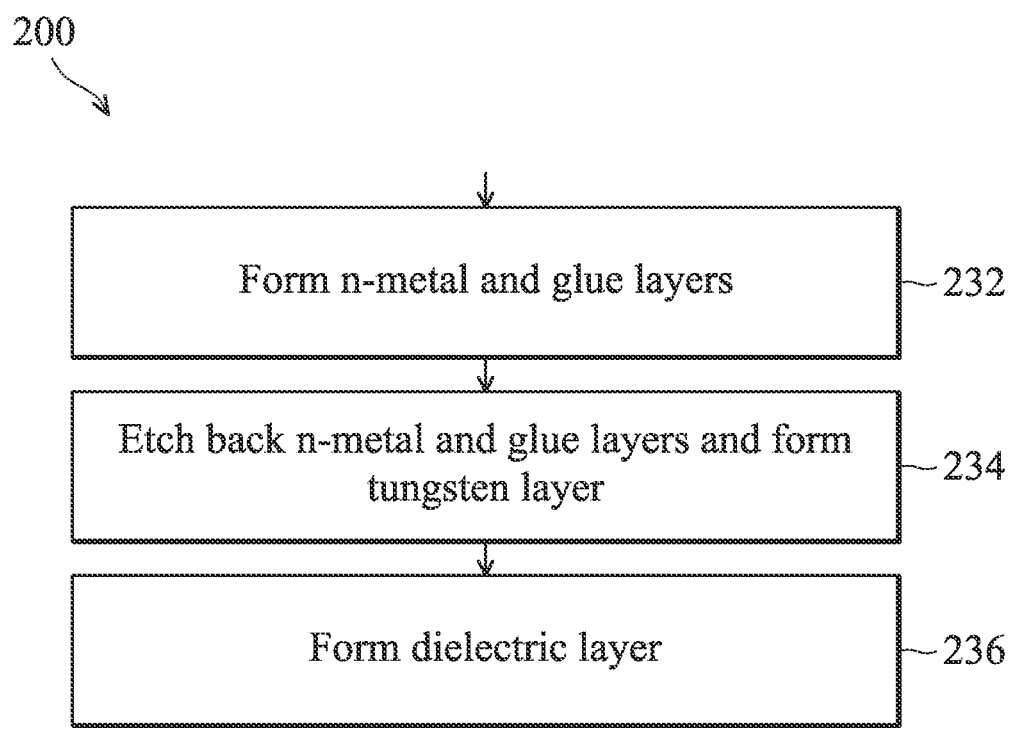

FIGS. 2A-2B illustrate a flowchart of a method 200 to form a semiconductor device 300, according to one or more embodiments of the present disclosure. For example, at least some of the operations of the method 200 can be used to form a FinFET device (e.g., FinFET device 100), a nanosheet transistor device, a nanowire transistor device, a vertical transistor, or the like. It is noted that the method 200 is merely an example, and is not intended to limit the present disclosure. Accordingly, it is understood that additional operations may be provided before, during, and after the method 200 of FIGS. 2A-2B, and that some other operations may only be briefly described herein. In some embodiments, operations of the method 200 may be associated with cross-sectional views of an example FinFET device at various fabrication stages as shown in FIGS. 3-21, respectively, which will be discussed in further detail below.

In brief overview, the method 200 starts with operation 202 of providing a substrate. The method 200 continues to operation 204 of forming fins. The method 200 continues to operation 206 of forming isolation regions. The method 200 continues to operation 208 of forming a dummy gate structure. The method 200 continues to operation 210 of forming sidewall gate spacers. The method 200 continues to operation 212 of forming source/drain regions 800. The method 200 continues to operation 214 of forming an interlayer dielectric (ILD). The method 200 continues to operation 216 of forming gate trenches. The method 200 continues to operation 218 of ILD structures arranged in first and second regions. The method 200 continues to operation 220 of forming a processing layer and a coating layer on the processing layer. The method 200 continues to operation 222 of performing a planarization etch. The method 200 continues to operation 224 of performing a conformal etch. The method 200 continues to operation 226 of performing a wet pull-back etch. The method 200 continues to operation 228 of removing the coating layer. The method 200 continues to operation 230 of removing portion of gate dielectric. The method 200 continues to operation 232 of forming n-metal and glue layers. The method 200 continues to operation 234 of etching back n-metal and glue layers, and forming a tungsten layer. The method 200 continues to operation 236 of forming a dielectric layer above the tungsten layer.

As mentioned above, FIGS. 3-21 each illustrates, in a cross-sectional view, a portion of a semiconductor device 300 at various fabrication stages of the method 200 of FIGS. 2A-2B. Although FIGS. 3-21 illustrate the semiconductor device 300, it is understood the semiconductor device 300 may include a number of other devices such as inductors, fuses, capacitors, coils, etc., which are not shown in FIGS. 3-21, for purposes of clarity of illustration. FIGS. 3-6 illustrate cross-sectional views of the device 300 along cross-section Y-Y (as indicated in FIG. 1); and FIGS. 7-21 illustrate cross-sectional views of the device 300 along cross-section X-X (as indicated in FIG. 1).

Figure 3:
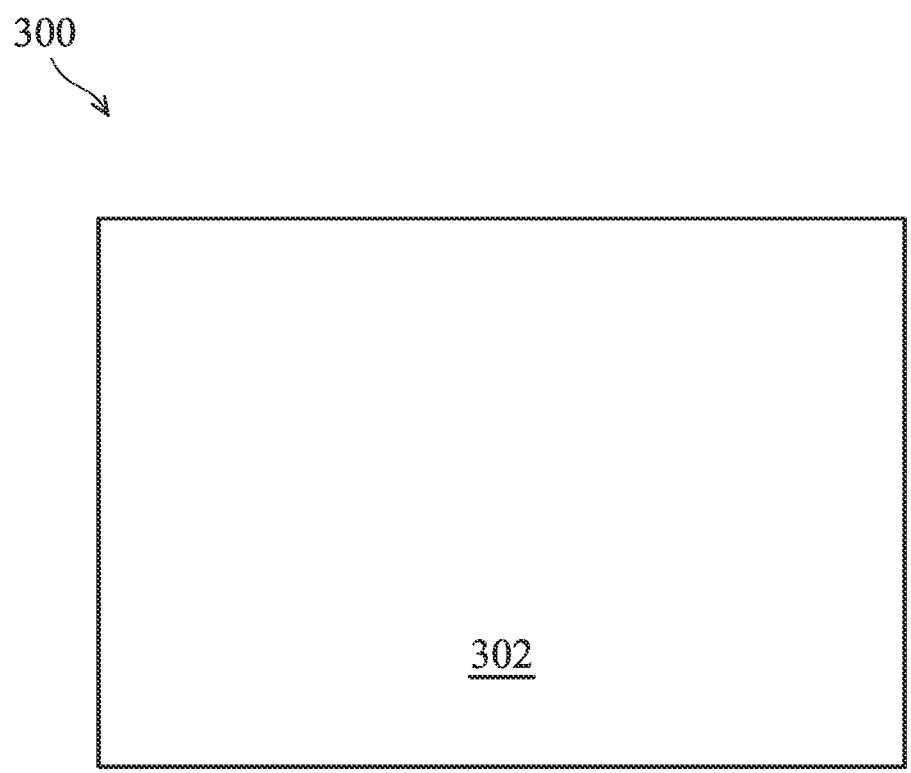
FIGS. 3-21 illustrate cross-sectional views of an example FinFET device (or a portion of the example FinFET device) during various fabrication stages, made by the method of FIGS. 2A-2B, in accordance with some embodiments.

Corresponding to operation 202 of FIG. 2A, FIG. 3 is a cross-sectional view of the semiconductor device 300 including a semiconductor substrate 302 at one of the various stages of fabrication. The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
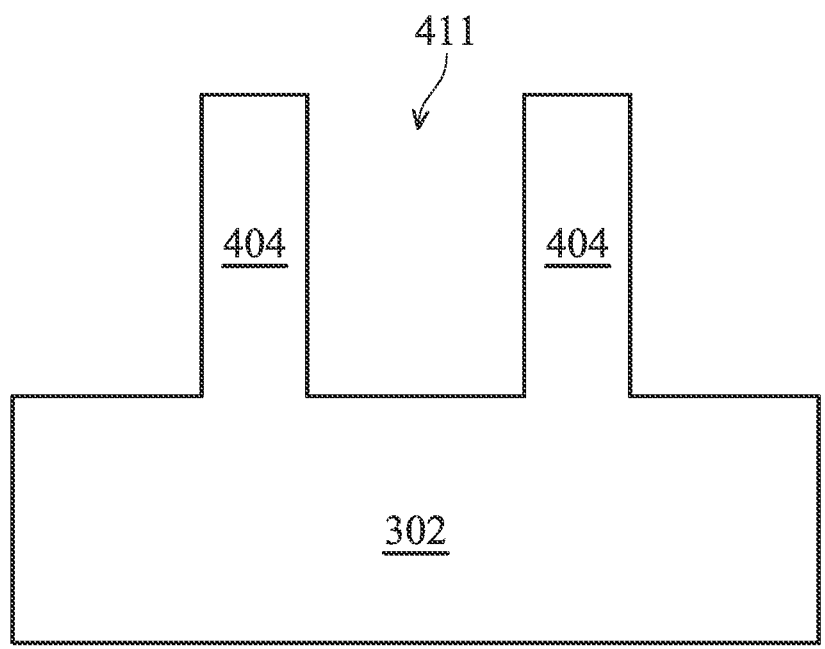

Corresponding to operation 204 of FIG. 2A, FIG. 4 is a cross-sectional view of the semiconductor device 300 including (semiconductor) fins 404 at one of the various stages of fabrication. Although two fins are shown in the illustrated embodiment of FIG. 4 (and the following figures), it should be appreciated that the semiconductor device 300 can include any number of fins while remaining within the scope of the present disclosure. In some embodiments, the fins 404 are formed by patterning the substrate 302 using, for example, photolithography and etching techniques. For example, a mask layer, such as a pad oxide layer and an overlying pad nitride layer, may be formed over the substrate 302.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching.

The patterned mask layer is subsequently used to pattern exposed portions of the substrate 302 to form trenches (or openings) 411, thereby defining fins 404 between adjacent trenches 411 as illustrated in FIG. 4. In some embodiments, the fins 404 are formed by etching trenches in the substrate 302 using, for example, reactive ion etch (RIE), neutral beam etch (NBE), the like, or combinations thereof. The etching may be anisotropic. In some embodiments, the trenches 411 may be strips (viewed from the top) parallel to each other, and closely spaced with respect to each other. In some embodiments, the trenches 411 may be continuous and surround the fins 404.

The fins 404 may be patterned by any suitable method. For example, the fins 404 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

Figure 5:
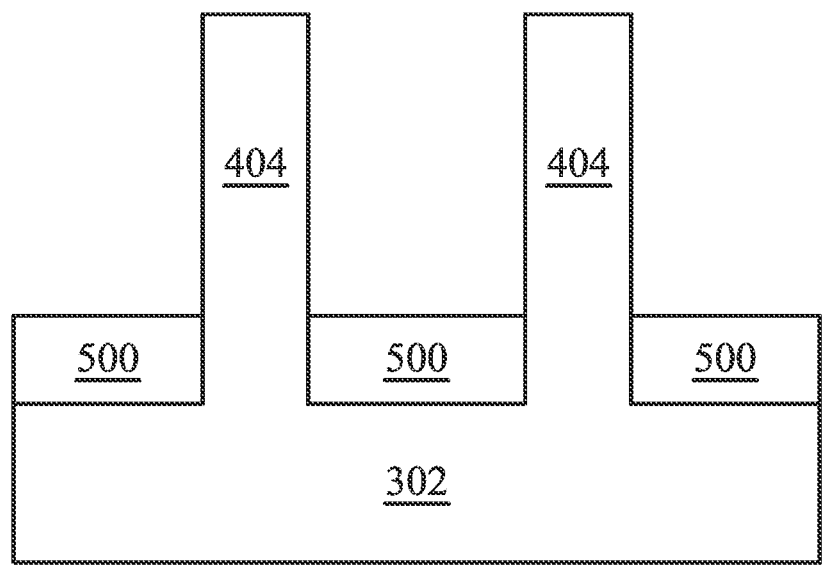

Corresponding to operation 206 of FIG. 2, FIG. 5 is a cross-sectional view of the semiconductor device 300 including isolation regions 500 at one of the various stages of fabrication. The isolation regions 500, which are formed of an insulation material, can electrically isolate neighboring fins 404 from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 500 and top surfaces of the fins 404 that are coplanar (not shown, the isolation regions 500 will be recessed as shown in FIG. 5). The patterned mask may also be removed by the planarization process.

In some embodiments, the a liner, e.g., a liner oxide (not shown), may be provided at the interface between each of the isolation regions 500 and the substrate 302 (fins 404). In some embodiments, the liner oxide is formed to reduce crystalline defects at the interface between the substrate 302 and the isolation region 500. Similarly, the liner oxide may also be used to reduce crystalline defects at the interface between the fin 404 and the isolation region 500. The liner oxide (e.g., silicon oxide) may be a thermal oxide formed through a thermal oxidation of a surface layer of the substrate 302, although other suitable methods may also be used to form the liner oxide.

Next, the isolation regions 500 are recessed to form shallow trench isolation (STI) regions 500, as shown in FIG. 5. The isolation regions 500 are recessed such that the upper portions of the fins 404 protrude from between neighboring STI regions 500. Respective top surfaces of the STI regions 500 may have a flat surface (as illustrated), a convex surface, a concave surface (such as dishing), or combinations thereof. The top surfaces of the STI regions 500 may be formed flat, convex, and/or concave by an appropriate etch. The isolation regions 500 may be recessed using an acceptable etching process, such as one that is selective to the material of the isolation regions 500. For example, a dry etch or a wet etch using dilute hydrofluoric (DHF) acid may be performed to recess the isolation regions 500.

FIGS. 3 through 5 illustrate an embodiment of forming one or more fins (such as fins 404), but a fin may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the fin 404 that includes the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 404 may include silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6:
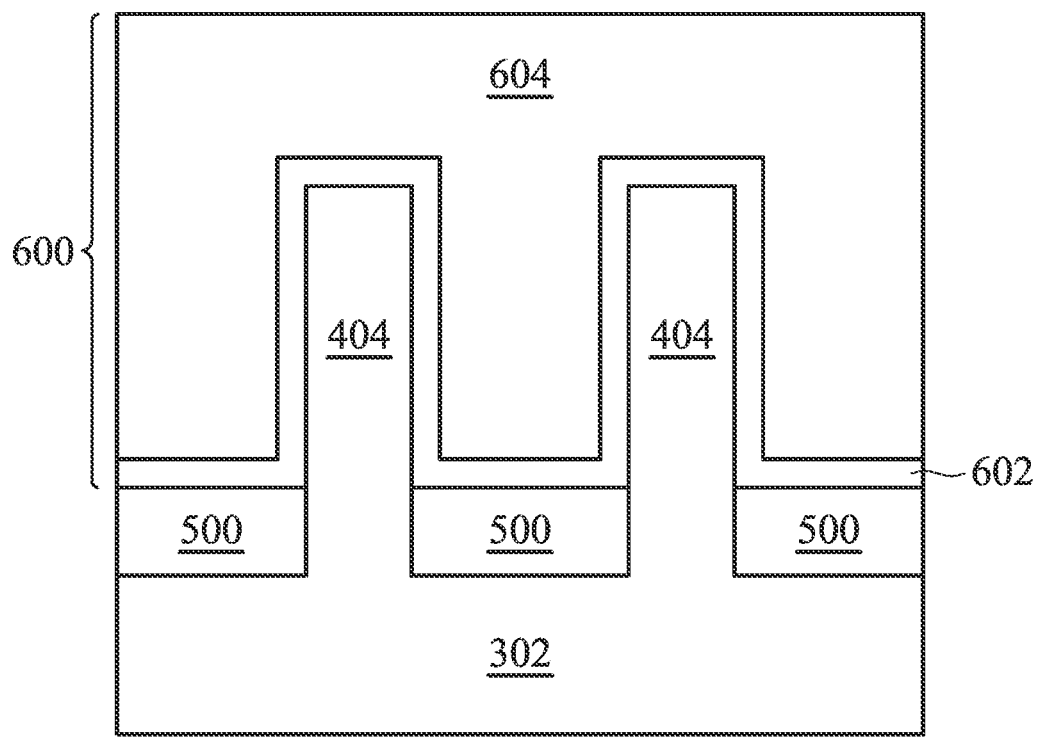

Corresponding to operation 208 of FIG. 2A, FIG. 6 is a cross-sectional view of the semiconductor device 300 including a dummy gate structure 600 at one of the various stages of fabrication. The dummy gate structure 600 may include a dummy gate dielectric 602 and a dummy gate 604, in some embodiments. A mask may be formed over the dummy gate structure 600. To form the dummy gate structure 600, a dielectric layer may be formed on the fins 404. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form the mask. The pattern of the mask then may be transferred to the gate layer and the dielectric layer by an acceptable etching technique to form the dummy gate 604 and the underlying dummy gate dielectric 602, respectively. The dummy gate 604 and the dummy gate dielectric 602 cover a central portion (e.g., a channel region) of the fins 404. The dummy gate 604 may also have a lengthwise direction (e.g., direction Y-Y of FIG. 1) substantially perpendicular to the lengthwise direction (e.g., direction of X-X of FIG. 1) of the fins 404.

The dummy gate dielectric 602 is shown to be formed over the fins 404 (e.g., over top surfaces and sidewalls of the fins 404) and over the STI regions 500 in the example of FIG. 6. In other embodiments, the dummy gate dielectric 602 may be formed by, e.g., thermal oxidization of a material of the fin 404, and therefore, may be formed over the fins 404 but not over the STI regions 500. It should be appreciated that these and other variations are still included within the scope of the present disclosure.

FIGS. 7-21 illustrate the cross-sectional views of further processing (or making) of the semiconductor device 300 along cross-section X-X (along a longitudinal axis of the fins 404), as shown in FIG. 1. In brief overview, three dummy gate structures 600 are illustrated over a fin 404 in the examples of FIGS. 7-10. It should be appreciated that more or less than three dummy gate structures can be formed over the fins 404, while remaining within the scope of the present disclosure.

Figure 7:
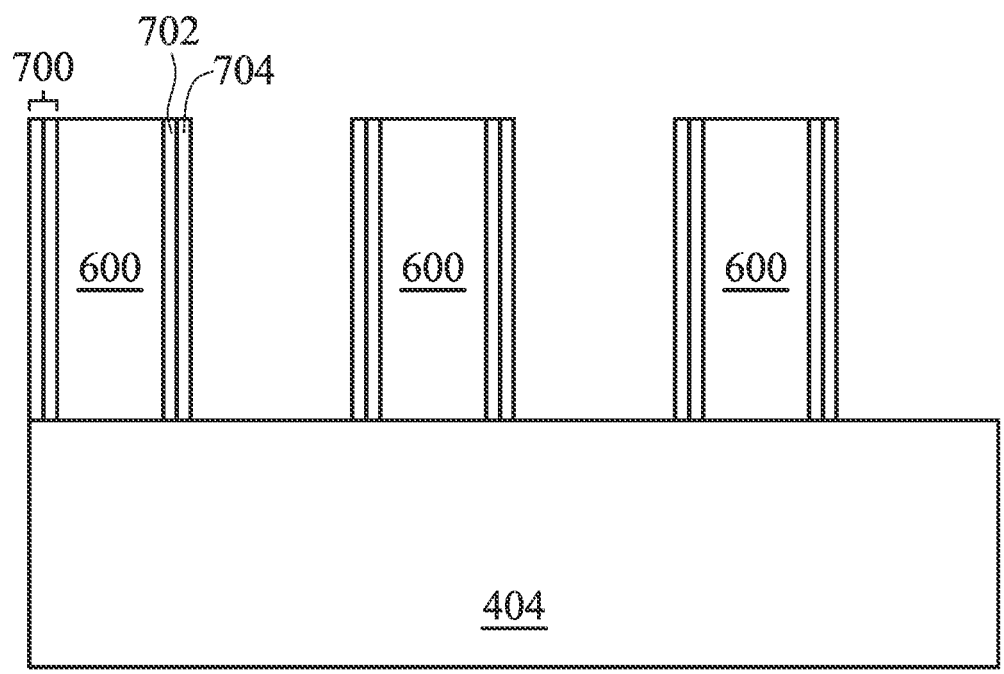

Corresponding to operation 210 of FIG. 2A, FIG. 7 is a cross-sectional view of the semiconductor device 300 including sidewall gate spacers 700 formed on the sidewalls of the dummy gate structures 600 at one of the various stages of fabrication.

Referring to FIG. 7, in some embodiments, sidewall gate spacers 700 are formed around (e.g., along and contacting the sidewalls of) the dummy gate structures 600. The sidewall gate spacers 700 may a single layer or may be formed of multiple layers. It should be understood that any number of gate spacers can be formed around the dummy gate structures 600 while remaining within the scope of the present disclosure.

The sidewall gate spacers 700 may each include a first gate spacer 702 and a second gate spacer 704, for example. The first gate spacer 702 may be a low-k spacer and may be formed of a suitable dielectric material, such as silicon oxide, silicon oxycarbonitride, or the like. The second gate spacer 704 may be formed of a nitride, such as silicon nitride, silicon oxynitride, silicon carbonitride, the like, or combinations thereof. Any suitable deposition method, such as thermal oxidation, chemical vapor deposition (CVD), or the like, may be used to form the first gate spacer 702 and the second gate spacer 704. In accordance with various embodiments, the first gate spacer 702 and the second gate spacer 704 are formed of different materials to provide etching selectivity in subsequent processing. The first gate spacer 702 and the second gate spacer 704 may sometimes be collectively referred to as gate spacers 702/704.

The shapes and formation methods of the gate spacers 702/704 as illustrated in FIG. 7 (and the following figures) are merely non-limiting examples, and other shapes and formation methods are possible. These and other variations are fully intended to be included within the scope of the present disclosure.

Figure 8:
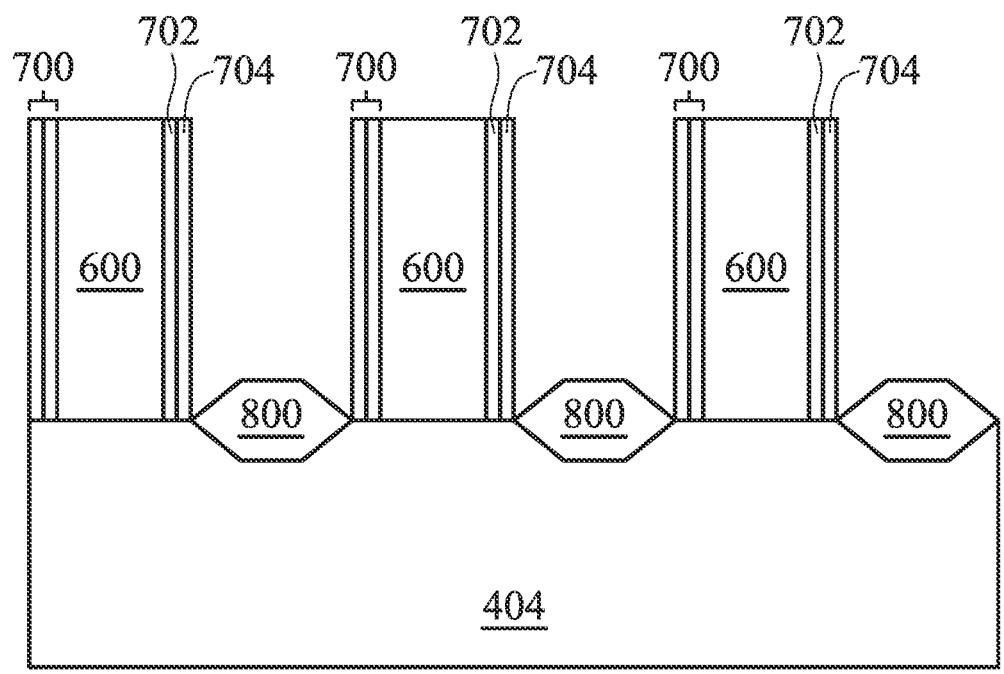

Corresponding to operation 212 of FIG. 2A, FIG. 8 is a cross-sectional view of the semiconductor device 300 including a number of source/drain regions 800 at one of the various stages of fabrication. The source/drain regions 800 are formed in recesses of the fins 404 adjacent to the dummy gate structures 600. For example, the source/drain regions 800 and the dummy gate structures 600 are alternately arranged. In other words, one source/drain region 800 is sandwiched between adjacent dummy gate structures 600 and/or merely one side of the source/drain region 800 is disposed next to a dummy gate structure 600. The recesses are formed by, e.g., an anisotropic etching process using the dummy gate structures 600 as an etching mask, in some embodiments, although any other suitable etching process may also be used.

The source/drain regions 800 are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 8, the epitaxial source/drain regions 800 may have surfaces raised from respective surfaces of the fin 404 (e.g. raised above the non-recessed portions of the fin 404) and may have facets. In some embodiments, the source/drain regions 800 of the adjacent fins may merge to form a continuous epitaxial source/drain region (not shown). In some embodiments, the source/drain regions 800 of the adjacent fins may not merge together and remain separate source/drain regions 800 (not shown). In some embodiments, when the resulting semiconductor device is an n-type FinFET, the source/drain regions 800 can include silicon carbide (SiC), silicon phosphorous (SiP), phosphorous-doped silicon carbon (SiCP), or the like. In some embodiments, when the resulting semiconductor device is a p-type FinFET, the source/drain regions 800 comprise SiGe, and a p-type impurity such as boron or indium.

The epitaxial source/drain regions 800 may be implanted with dopants to form source/drain regions 800 followed by an annealing process. The implanting process may include forming and patterning masks such as a photoresist to cover the regions of the semiconductor device 300 that are to be protected from the implanting process. The source/drain regions 800 may have an impurity (e.g., dopant) concentration in a range from about $1\times10^{19}$ cm$^{-3}$ to about $1\times10^{21}$ cm$^{-3}$. P-type impurities, such as boron or indium, may be implanted in the source/drain region 800 of a P-type transistor. N-type impurities, such as phosphorous or arsenide, may be implanted in the source/drain regions 800 of an N-type transistor. In some embodiments, the epitaxial source/drain regions 800 may be in situ doped during their growth.

Figure 9:
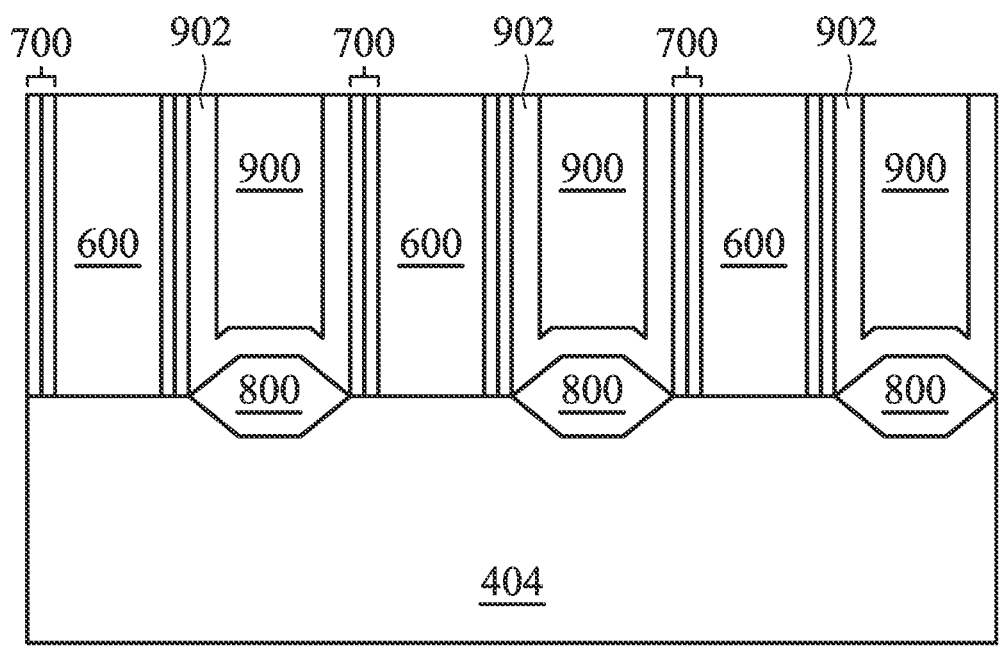

Corresponding to operation 214 of FIG. 2A, FIG. 9 is a cross-sectional view of the semiconductor device 300 including an interlayer dielectric (ILD) 900 at one of the various stages of fabrication. In some embodiments, prior to forming the ILD 900, a contact etch stop layer (CESL) 902 is formed over the structure illustrated in FIG. 9. The CESL 902 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 900 is formed over the CESL 902 and over the dummy gate structures 600. In some embodiments, the ILD 900 is formed of a dielectric material such as silicon oxide, phosphosilicate glass (PSG), borosilicate glass (BSG), boron-doped phosphosilicate glass (BPSG), undoped silicate glass (USG), or the like, and may be deposited by any suitable method, such as CVD, PECVD, or FCVD.

An example gate-last process (sometimes referred to as replacement gate process) is performed subsequently to replacing the dummy gate 604 and the dummy gate dielectric 602 of each of the dummy gate structures 600 with an active gate (which may also be referred to as a replacement gate or a metal gate).

Figure 10:
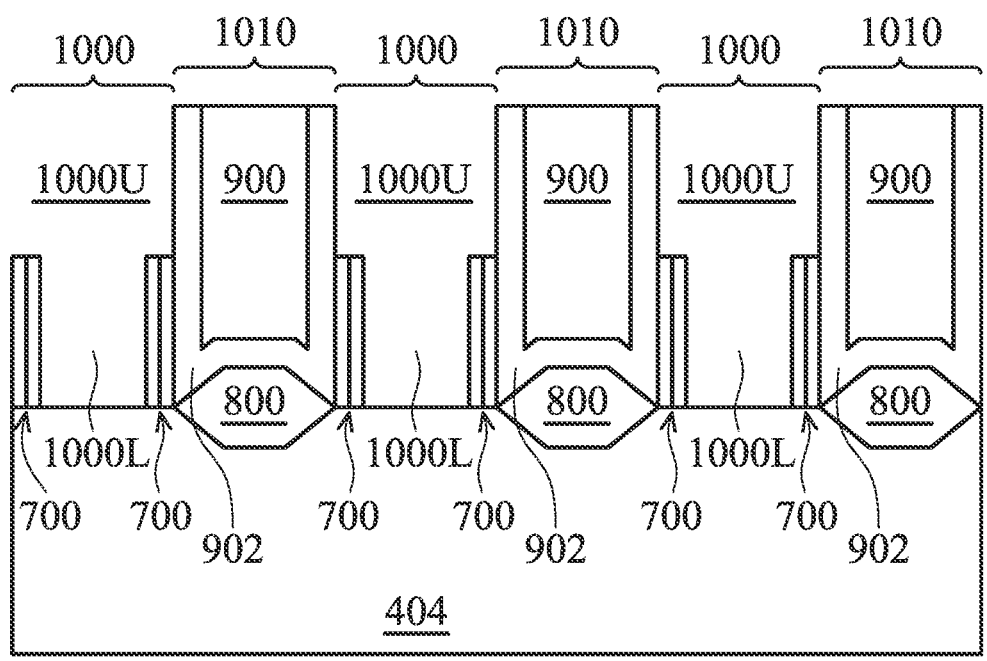

Corresponding to operation 216 of FIG. 2A, FIG. 10 is a cross-sectional view of the semiconductor device 300 in which the dummy gate structures 600 (FIG. 9) are removed to form respective gate trenches 1000, at one of the various stages of fabrication. Next, upper portions of the gate trenches 1000 are horizontally expanded by removing relative upper portions of the gate spacers 700, such that each of the gate trenches 1000 has an upper trench 1000U and a lower trench 1000L, where the upper trench 1000U is wider than the lower trench 1000L horizontally. Details of forming the gate trenches 1000 will be discussed below.

In some embodiments, to remove the dummy gate structures 600, one or more etching steps are performed to remove the dummy gate 604 and the dummy gate dielectric 602 directly under the dummy gate 604, so that the gate trenches 1000 (which may also be referred to as recesses) are formed between respective gate spacers 700. Each gate trench 1000 exposes the channel region of a fin 404. During the dummy gate removal, the dummy gate dielectric 602 may be used as an etch stop layer when the dummy gate 604 is etched. The dummy gate dielectric 602 may then be removed after the removal of the dummy gate 604.

Next, an anisotropic etching process, such as a dry etch process, is performed to remove upper portions of the gate spacer 700. In some embodiments, the anisotropic etching process is performed using an etchant that is selective to (e.g., having a higher etching rate for) the material of the first gate spacer 702, such that the first gate spacer 702 is recessed (e.g., upper portions removed) without substantially attacking the second gate spacer 704 and the dielectric layer 904. After the upper portions of the first gate spacers 702 are removed, upper sidewalls of the second gate spacer 704 are exposed. In some embodiments, upper sidewalls of the second gate spacer 704 may also be removed.

As illustrated in FIG. 10, after the upper portions of the first gate spacers 702, and in some embodiments upper portions of the second gate spacers 704, are removed, each of the gate trenches 1000 has an upper trench 1000U and a lower trench 1000L. The lower trench 1000L is between the remaining lower portions of the first gate spacer 702. The upper trench 1000U is over the lower trench 1000L, and is defined (e.g., bordered) by the upper sidewalls of the second gate spacer 704, if the upper sidewalls of the second gate spacer 704 are not removed. The width of the upper trench 1000U may be between 3 and 30 nm.

Figure 11:
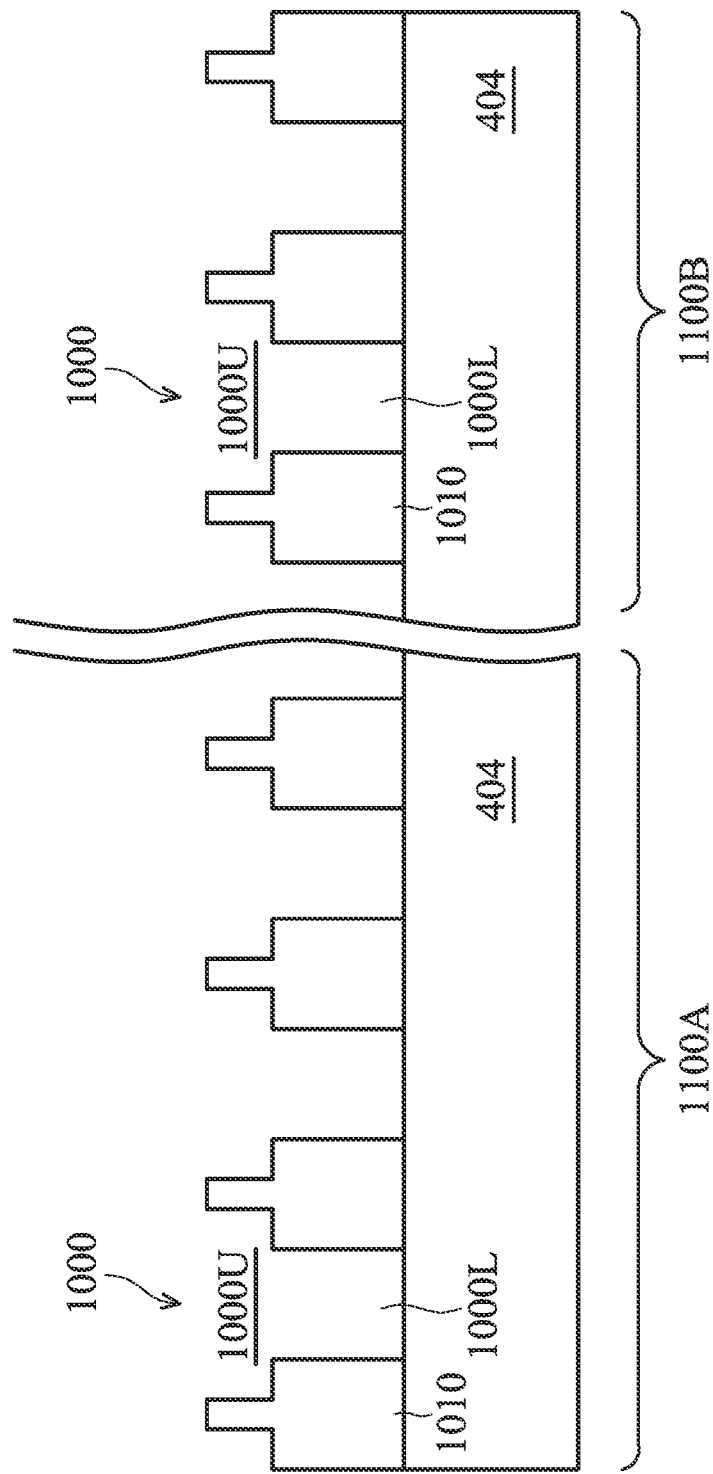

Corresponding to operation 218 of FIG. 2A, FIG. 11 illustrates ILD structures 1010 where some of the ILD structures 1010 are arranged in a first region 1100A and others of the ILD structures 1010 are arranged in a second region 1100B. The ILD structures 1010 may include the features as shown in FIG. 10 such as the gate spacers 700 and ILD 900. Thus, first ILD structures of the ILD structures 1010 with first trenches between are arranged in the first region 1100A, while second ILD structures of the ILD structures 1010 with second trenches between are arranged in the second region 1100B. As discussed above, the ILD structures 1010 include the ILD 900 and the remaining sidewall spacer 700. The trenches 1000 between adjacent ILD structures 1010 include an upper trench 1000U, which is wider than a lower trench 1000L. The trenches 1000 in the first region 1100A may be narrower than at least some of the trenches 1000 in the second region 1100B, such that the density of the ILD structures 1010 is greater in the first region 1100A than in the second region 1100B. This difference in density may cause a loading effect when a coating layer 1200 (FIG. 12) is deposited on the semiconductor device, thus reducing a height of the coating layer 1200 in the second region 1100B as compared to a height of the coating layer 1200 in the first region 1100A. FIG. 11 illustrates four ILD structures 1010 in the first region 1100A and three ILD structures 1010 in the second region 1100B for the sake of illustration. The number of ILD structures 1010 in the first region 1100A and second region 1100B, however, may be other than four and three, respectively.

Figure 12:
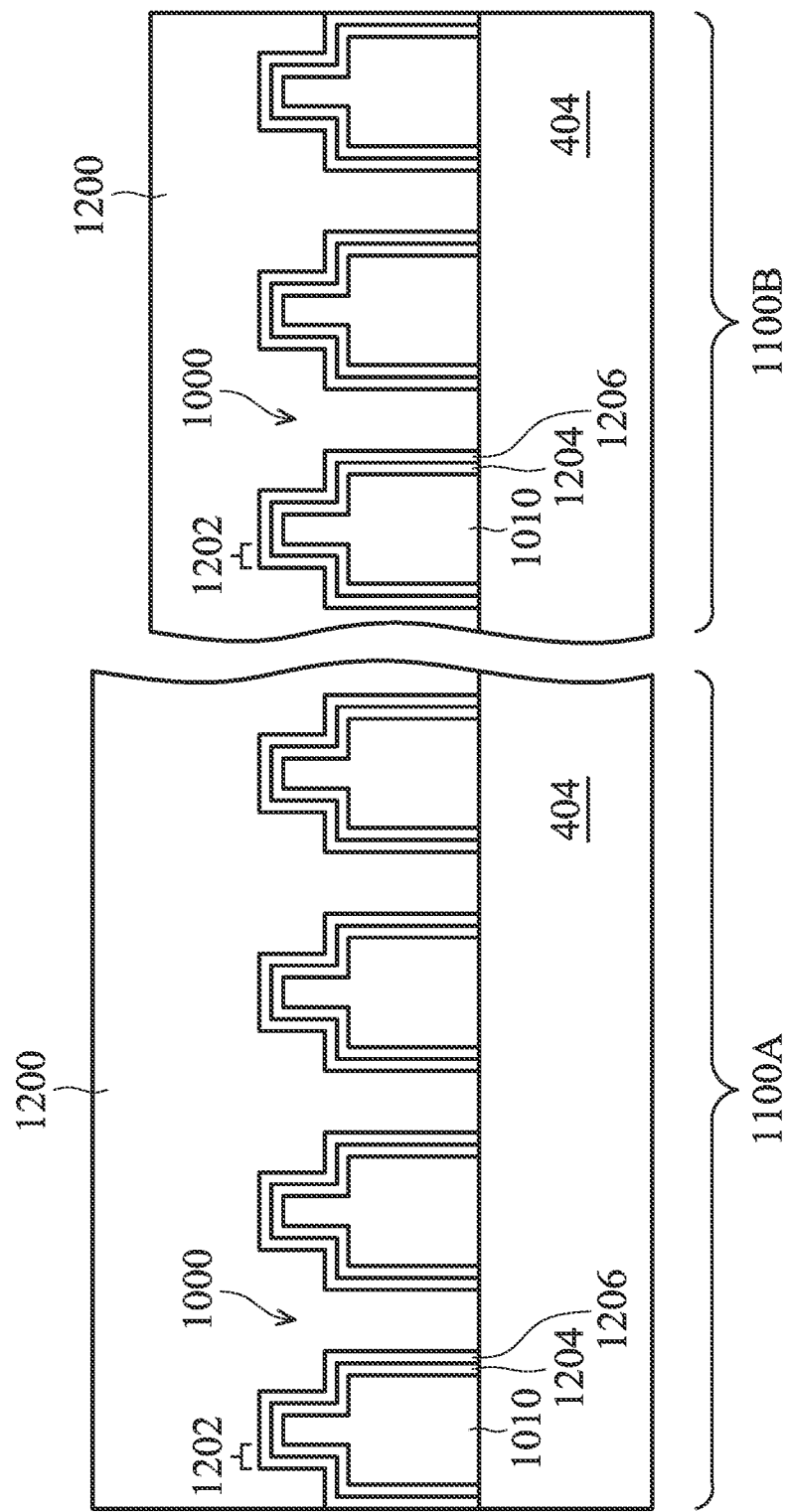

Corresponding to operation 220 of FIG. 2A, FIG. 12 illustrates the formation of a processing layer 1202 on sidewalls of the ILD structures 1010, and then formation of a coating layer 1200 on the processing layer 1202. The processing layer 1202 may be a single layer, or may have multiple sub-layers. The processing layer 1202 may be etched or otherwise processed upon sufficient of the coating layer 1200 being removed to expose the processing layer 1202.

The processing layer 1202 may include, for example, a gate dielectric layer 1204 on sidewalls of the ILD structures 1010, and a p-metal (p-type work function metal) layer 1206, as a work function metal layer, on the gate dielectric 1204. The processing layer 1202 may include in general, different types of material, such as conductors, semiconductors, and insulating materials.

In example embodiments, the gate dielectric layer 1204 includes a high-k dielectric material, and in these embodiments, the gate dielectric layers 1204 may have a k value greater than about 7.0, and may include a metal oxide or a silicate of Hf, Al, Zr, La, Mg, Ba, Ti, Pb, and combinations thereof. The formation methods of gate dielectric layer 1204 may include molecular beam deposition (MBD), atomic layer deposition (ALD), PECVD, and the like.

Next, the p-metal layer 1206 is formed (e.g., conformally) over the gate dielectric layer 1204. Example P-type work function metals that may be included as the p-metal layer 1206 include TiN, TaN, Ru, Mo, Al, WN, $ZrSi_2$, $MoSi_2$, $TaSi_2$, $NiSi_2$, WN, other suitable P-type work function materials, or combinations thereof. The p-metal layer 1206 may be deposited by CVD, physical vapor deposition (PVD), ALD, and/or other suitable process.

The coating layer 1200 may be formed as a photoresist layer, and may additionally or alternatively include a bottom antireflection coating (BARC). The BARC may be an organic thermally crosslinking material, for example. The photoresist and BARC may be spun on, deposited, or otherwise formed on and over the first region 1100A and second region 1100B. As can be seen in FIG. 12, the height of the coating layer 1200 is greater in the first region 1100A, which has a higher density of ILD structures 1010 than in the second region 1100B due to loading.

Figure 13:
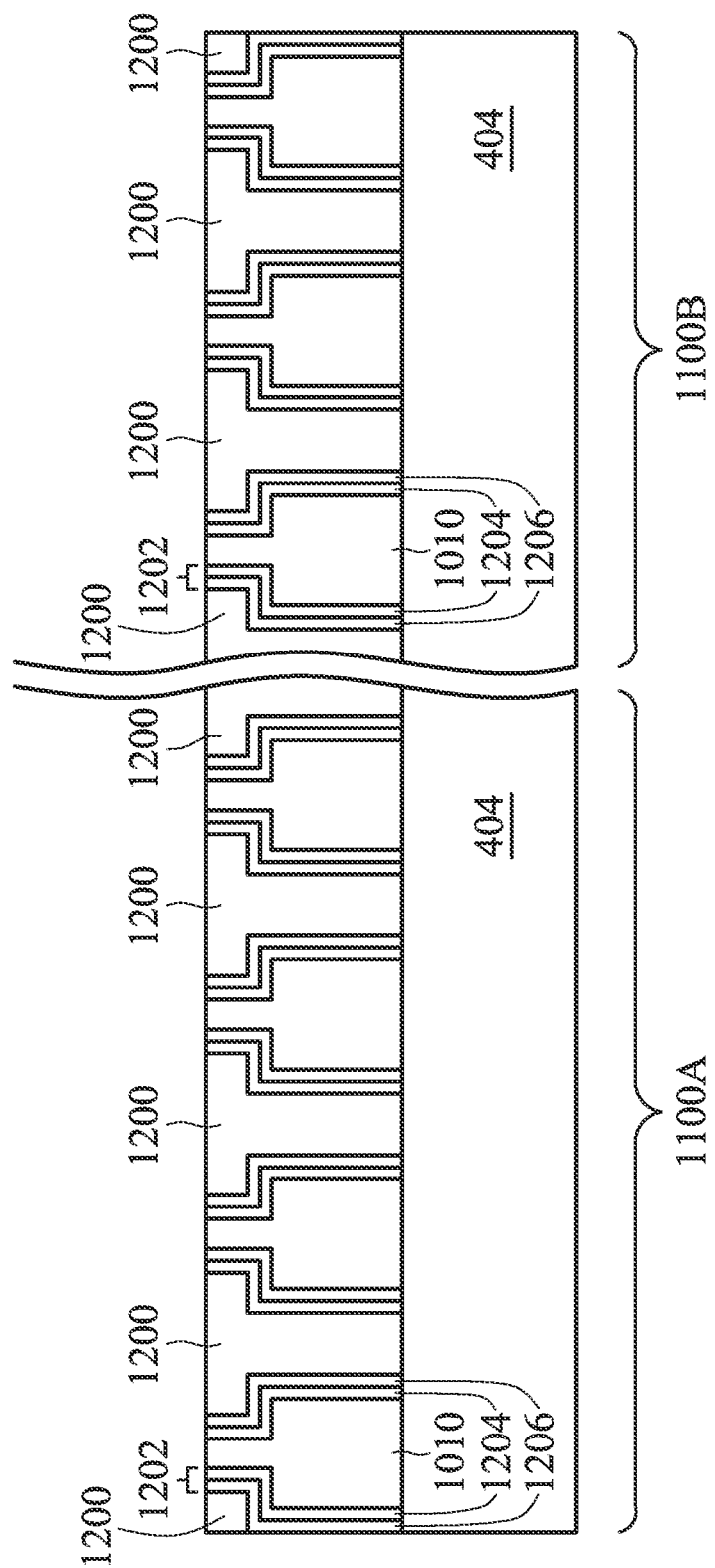

Corresponding to operation 222 of FIG. 2A, FIG. 13 illustrates a planarization etch where the coating layer 1200 is etched in such a manner that a height of a top surface of the coating layer 1200 in the first region 1100A is the same as a height of a top surface of the coating layer 1200 in the second region 1100B. As shown, the coating layer 1200 is etched such that its top surface is near a top surface of the ILD structures 1010.

The etch in FIG. 13 may be, for example, a dry etch under conditions that etching of the coating layer 1200 occurs at regions outside the trenches 1000, but not substantially within the trenches, although some etching into the trenches 1000 may occur. In this regard, a planarization processing gas may be applied to the coating layer 1200 such that etching of the coating layer 1200 occurs substantially only at regions outside the trenches 1000. The purpose of the etch is to reduce the difference in height of the coating layer 1200 in the first region 1100A and the second region 1100B. The dry etch may be performed in a plasma chamber, for example. The planarization processing gas may include an etching gas, which tends to etch the coating layer 1200, and a deposition gas, which tends to deposit material. The planarization processing gas is applied to the coating layer 1200 in a composition and bias such that etching of the coating layer 1200 occurs only at regions outside the trenches 1000. The etching stops in the trenches 1000 due to heavy deposition, and thus processes the coating layer 1200 similar to chemical mechanical polishing, leaving the coating layer 1200 only in the trenches 1000, thus removing coating loading between regions 1100A and 1100B. The deposition gas may include He, $CH_4$ or $H_2$ gas, for example, and the etch gas may include $NH_3$, for example.

As an example, the deposition gas may be $CH_4$ and the etch gas may include $NH_3$. The $NH_3$ flow may be between 50 and 200 sccm. An Ar gas may have a flow between 100 and 400 sccm. The $CH_4$ flow may be between 100 and 300 sccm. The pressure range may be between 50 and 200 mT. The plasma power range may be between 50 and 300 W.

Figure 14:
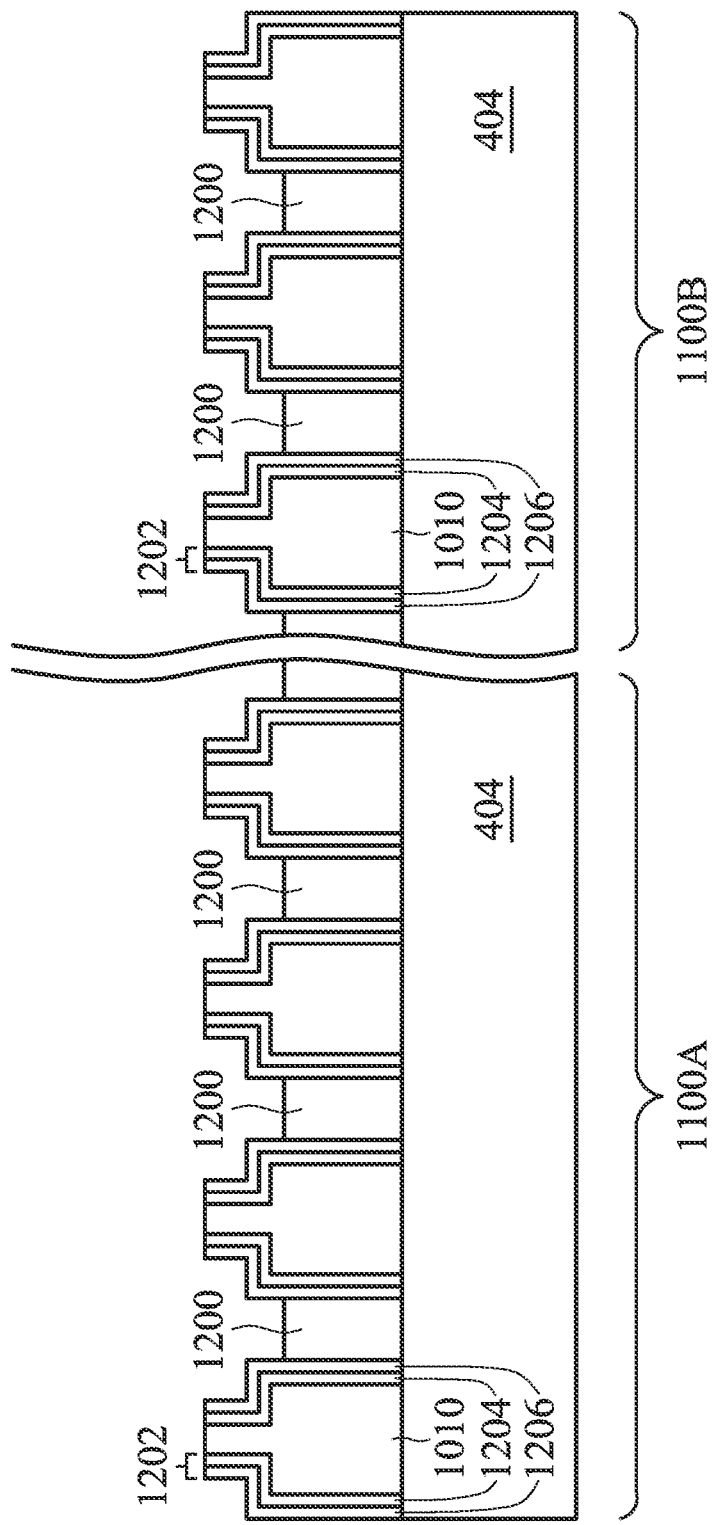

Corresponding to operation 224 of FIG. 2A, FIG. 14 illustrates the coating layer 1200 being etched in a conformal etch in such a manner to remove the coating layer 1200 from the upper trench 1000U, and to leave the coating layer 1200 in lower trench 1000L both in the first region 1100A and in the second region 1100B. In the conformal etch, the coating layer 1200 is etched such that its top surface is near the interface between the upper trench 1000U and the lower trench 1000L, and the coating layer 1200 has a substantially same height in the first region 1100A and in the second region 1100B. The height difference may be 0 to 10 nm, for example.

The etch in FIG. 14 may be, for example, a dry etch under conditions that etching of the coating layer 1200 removes the coating layer 1200 from the upper trench 1000U, and leaves the coating layer 1200 in lower trench 1000L. In this regard, a conformal etch processing gas may be applied to the coating layer 1200 such that etching of the coating layer 1200 removes the coating layer 1200 from the upper trench 1000U, and leaves the coating layer 1200 in lower trench 1000L. The dry etch may be performed in a plasma chamber, for example.

The processing gas for the conformal etch may include an etching gas, which tends to etch the coating layer 1200, and a deposition gas, which tends to deposit material. The processing gas for the conformal etch is applied to the coating layer 1200 in a composition and bias such that etching of the coating layer 1200 removes the coating layer 1200 from the upper trench 1000U, and leaves the coating layer 1200 in lower trench 1000L. For the conformal etch, the deposition gas may include He, $CH_4$, CxFy, Cl, HBr, BCl, $H_2$, or Ar gas, for example, and the etch gas may include $NH_3$ and $N_2$, for example.

As an example of the conformal etch, the etch gas may include $NH_3$ and $N_2$. The $NH_3$ may have a flow between 50 and 200 sccm. The $N_2$ may have a flow between 300 and 1000 sccm. The pressure range may be between 50 and 200 mT. The plasma power range may be between 50 and 300 W.

Figure 15:
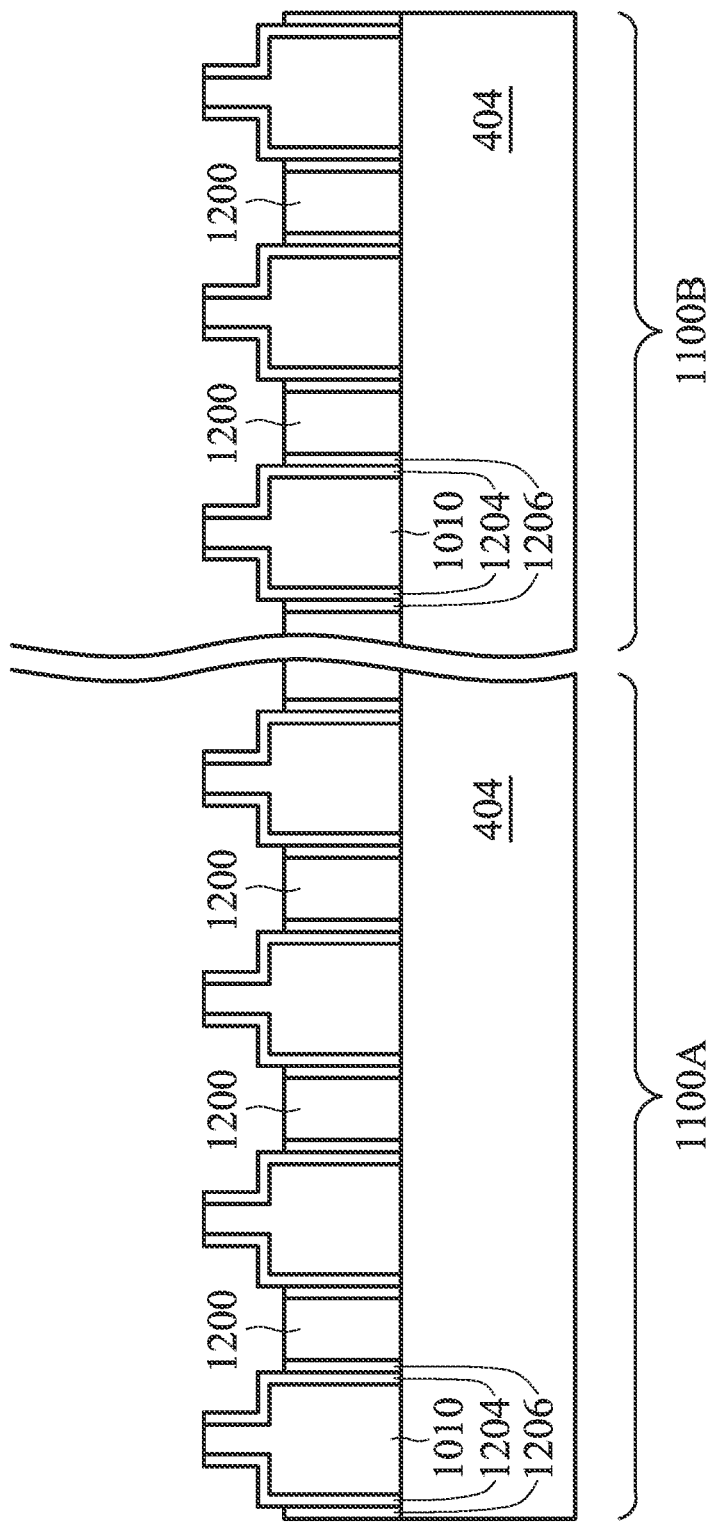

Corresponding to operation 226 of FIG. 2A, FIG. 15 illustrates an etch of the p-metal layer 1206 being etched in regions exposed by the conformal etch described with respect to FIG. 14. In particular the p-metal layer 1206 is exposed in the upper trench 1000U, but not in the lower trench 1000L in which the coating layer 1200 remains. The p-metal layer 1206 is etched to remove the p-metal layer 1206 from the upper trench 1000U. The p-metal layer 1206 may be etched for example in a wet pull-back etch process, which is selective to etching the p-metal layer 1206 over the gate dielectric layer 1204. While FIG. 15 illustrates an etch which etches the p-metal layer 1206, but does not etch the gate dielectric layer 1204, the metal layer 1206 and the gate dielectric layer 1204 may be etched in the same step.

The p-metal layer 1206 may be etched in a wet etch process. The wet etch process may be performed using a chemical comprising a base and an oxidizer, in some embodiments. For example, the chemical used may be a mixture of ammonium hydroxide ($NH_4OH$) and hydrogen peroxide ($H_2O_2$), where $NH_4OH$ functions as the base and $H_2O_2$ functions as the oxidizer. In some embodiments, a mixing ratio (e.g., volume ratio) between $NH_4OH$ and $H_2O_2$ is between about 1:1 and 1:2001 for the wet etch process. The wet etch process may be performed at a temperature between about 40° C. and about 70° C. for a duration between about 1 minute and about 5 minutes, or else may be ended using an endpoint detection process.

Figure 16:
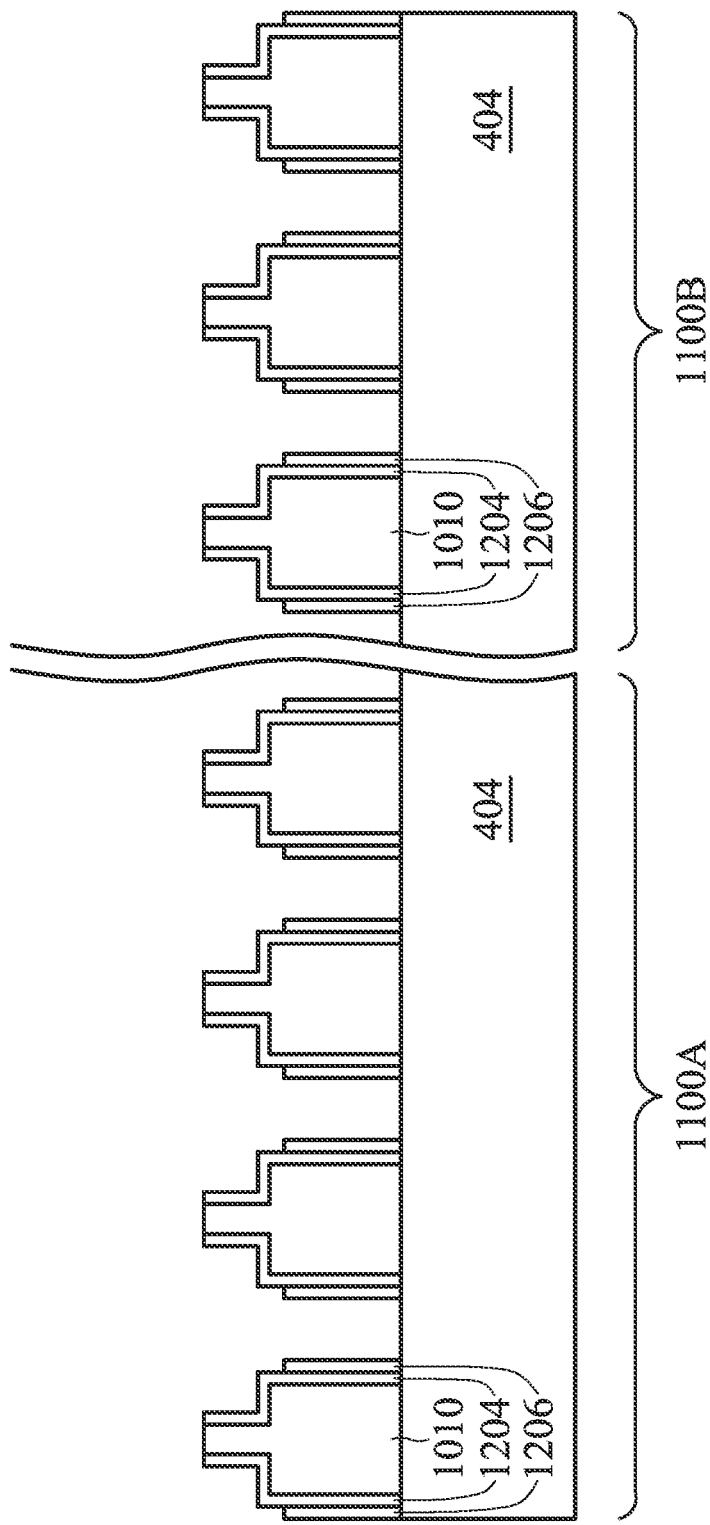
Figure 17:
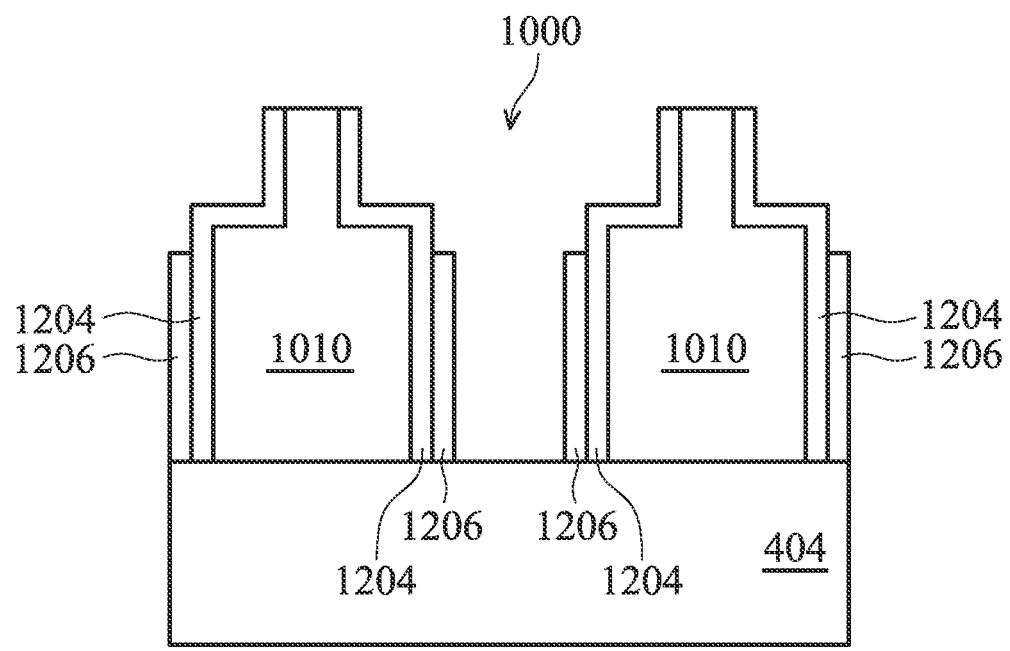

Corresponding to operation 228 of FIG. 2A, FIGS. 16 and 17 illustrates the removal of the coating layer 1200 after the wet etch of FIG. 15. The etchant for removing the coating layer 1200 depends on the material for the coating layer 1200. For example, if the coating layer 1200 includes a photoresist and a BARC, the coating layer 1200 may be removed using an ashing process which exposes the coating layer 1200 to oxygen.

FIG. 17 illustrates a portion of the semiconductor device 300 with two ILD structures 1010 with a trench 1000 between the two ILD structures 1010. Only two ILD structures 1010 with a trench 1000 between are shown in FIGS. 17-21 for the sake of simplicity. In general, the device 300 will have more than two ILD structures 1010, and corresponding trenches.

Figure 18:
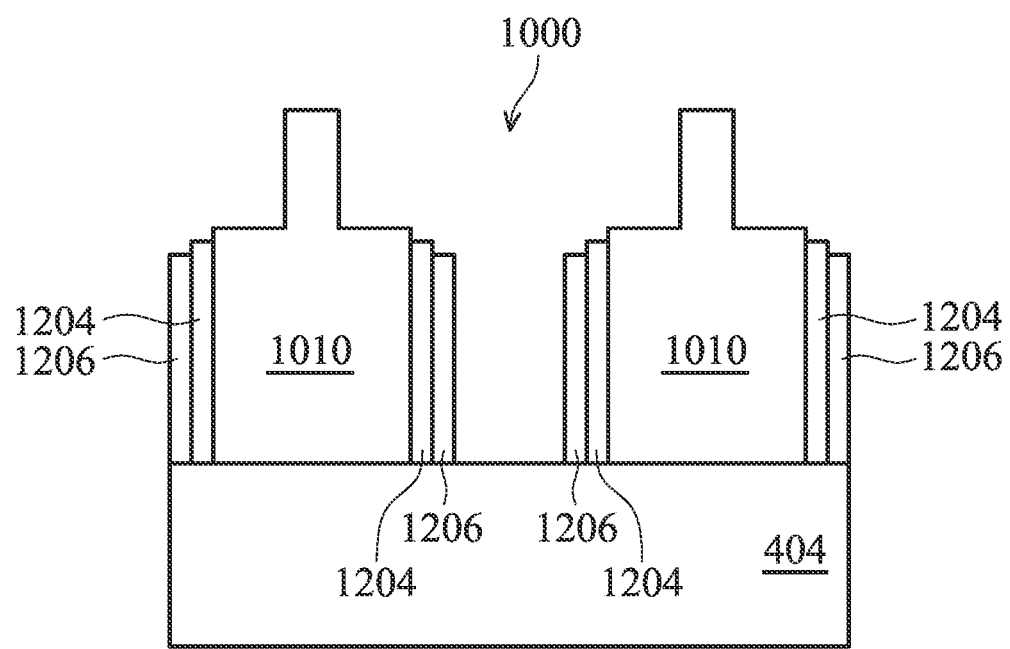

Corresponding to operation 230 of FIG. 2A, FIG. 18 illustrates the removal of a portion of the gate dielectric layer 1204 which is in the upper trench 1000U. Alternatively, the gate dielectric layer 1204 may be etched in the etch of FIG. 15. The portion of the gate dielectric layer 1204 may be removed by a wet etch process using a wet etching solution. The wet etching solution may include an etchant and an oxidant placed into a solvent, for example.

For example, the etchant may be an amine with a formula such as R—$NH_2$, R—N—R', $NR_1R_2R_3$, combinations of these, or the like, wherein each of R, R', $R_1$, $R_2$ and $R_3$ may be an alkyl group, a phenyl group, or the like. In other embodiments the etchant may be an amine such as tetramethylammonium hydroxide (TMAH), ammonium hydroxide ($NH_4OH$), tetrabutylammonium hydroxide (TBAH), combinations of these, or the like. However, any suitable etchant may be utilized.

In some embodiments, the oxidant may be a mixture of the fluoride-based acid with one or more other acids such as, for example, perchloric acid ($HClO_4$), chloric acid ($HClO_3$), hypochlorous acid (HClO), chlorous acid ($HClO_2$), metaperiodic acid ($HIO_4$), iodic acid ($HIO_3$), iodous acid ($HIO_2$), hypoiodous acid (HIO), perbromic acid ($HBrO_4$), bromic acid ($HBrO_3$), bromous acid ($HBrO_2$), hypobromous acid (HBrO), nitric acid ($HNO_3$), combinations of these, or the like. However, any suitable oxidant may be utilized.

Figure 19:
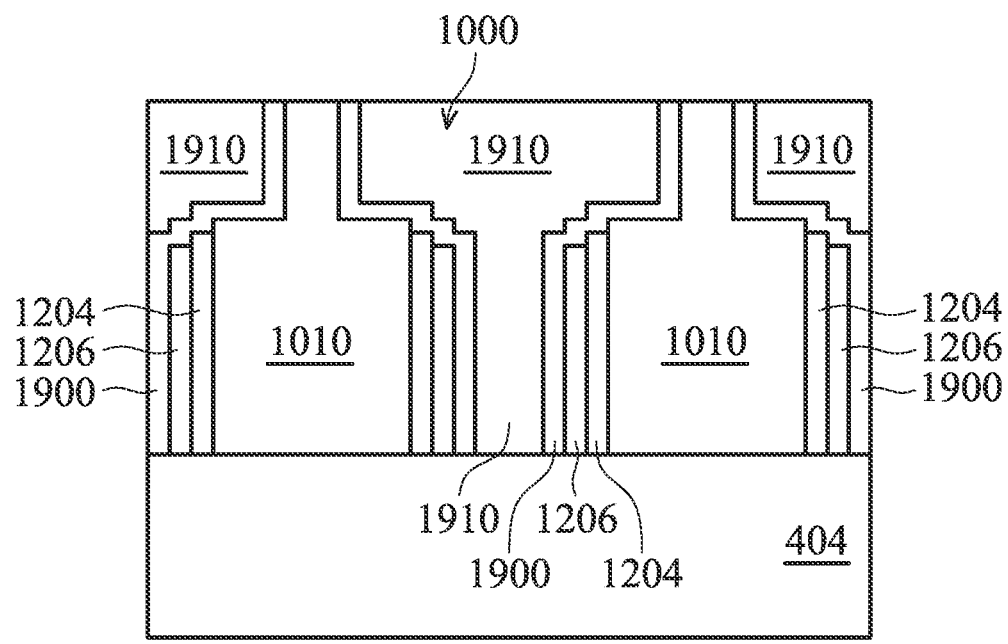

Corresponding to operation 232 of FIG. 2B, FIG. 19 illustrates the formation of an n-metal (n-type work function metal) layer 1900 and a glue layer 1910 on the interlevel dielectric structure 1010, and the p-metal layer 1206.

The n-metal layer 1900 may be formed (e.g., conformally) over the interlevel dielectric structure 1010, and the p-metal layer 1206. Example n-metal layers 1900 that may be included are Ti, Ag, TaAl, TaAlC, TiAlN, TaC, TaCN, TaSiN, Mn, Zr, other suitable N-type work function materials, or combinations thereof. The n-metal layer 1900 may be deposited by CVD, PVD, ALD, and/or other suitable process.

Next, the glue layer 1910 is formed (e.g., conformally) on the n-metal layer 1900. The glue layer 1910 functions as an adhesion layer between the underlying layer (e.g., 1900) and a subsequently formed material (e.g., 2000) over the glue layer 1910. The glue layer 1910 may be formed of a suitable material, such as titanium nitride, using a suitable deposition method such as CVD, PVD, ALD, or the like. Depending on the width of the lower trench 1000L and the thicknesses of the previously formed layers in the trenches, the glue layer 1910 may fill the remaining portions of the lower trench 1000L, as illustrated in the example of FIG. 19. Further, depending on the width of the upper trench 1000U, the width of the lower trench 1000L, and the thicknesses of the previously formed layers in the gate trenches, the glue layer 1910 may fill the whole trench 1000.

Figure 20:
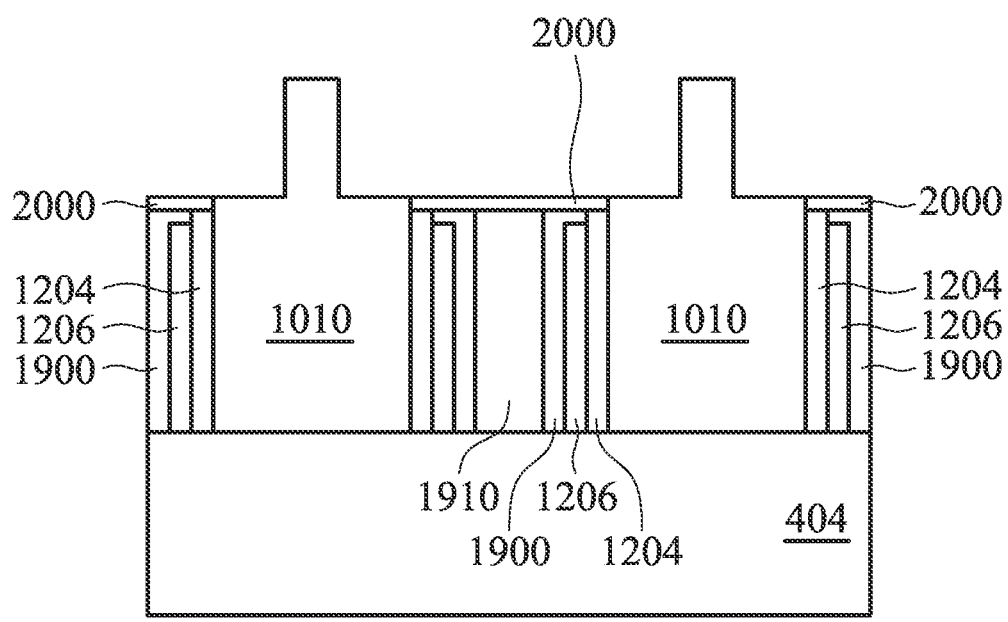

Corresponding to operation 234 of FIG. 2B, FIG. 20 illustrates the etchback of the n-metal layer 1900 and the glue layer 1910 on the interlevel dielectric structure 1010, and the formation of a tungsten layer 2000 on the etched back n-metal layer 1900 and glue layer 1910.

In some embodiments, a portion of the glue layer 1910 is removed from the upper trench 1000U of the trench 1000 by a glue layer pull-back process. In some embodiments, a wet etch process is performed as the glue layer pull-back process to selectively remove the glue layer 1910 from the upper trench 1000U without attacking (e.g., damaging, removing) the underlying layer (e.g., the n-metal layer 1900). The wet etch process is performed using a chemical including an acid and an oxidizer, in some embodiments. For example, the chemical used may be a mixture of hydrochloric acid (HCl) and hydrogen peroxide ($H_2O_2$), where HCl functions as the acid and $H_2O_2$ functions as the oxidizer. In some embodiments, a mixing ratio (e.g., volume ratio) between HCl and $H_2O_2$ is between about 1:1 and 1:20 for the wet etch process. The wet etch process may be performed at a temperature between about 40° C. and about 70° C. for a duration between about 1 minute and about 5 minutes, or else may be ended using an endpoint detection process.

As illustrated in FIG. 20, after the glue layer 1910 pull-back process, at least a portion of the n-metal layer 1900 is exposed in the upper trench 1000U, and a remaining portion of the glue layer 1910 still fills the lower trench 1000L.

The n-metal layer 1900 is exposed in the upper trench 1000U, but not in the lower trench 1000L, and exposed portions of the n-metal layer 1900 may be etched in a wet etch, for example. The n-metal layer 1900 is etched to remove the n-metal layer 1900 from the upper trench 1000U. The n-metal layer 1900 may be etched for example in a wet pull-back etch process.

The wet etch process may be performed using a chemical comprising a base and an oxidizer, in some embodiments. For example, the chemical used may be a mixture of ammonium hydroxide ($NH_4OH$) and hydrogen peroxide ($H_2O_2$), where $NH_4OH$ functions as the base and $H_2O_2$ functions as the oxidizer. In some embodiments, a mixing ratio (e.g., volume ratio) between $NH_4OH$ and $H_2O_2$ is between about 1:1 and 1:2001 for the wet etch process. The wet etch process may be performed at a temperature between about 40° C. and about 70° C. for a duration between about 1 minute and about 5 minutes, or else may be ended using an endpoint detection process.

A tungsten layer 2000 may be formed on the n-metal layer 1900 and the glue layer 1910, for example, by PVD or CVD. The tungsten layer 2000 may be formed to directly contact the n-metal layer 1900 and the glue layer 1910.

Figure 21:
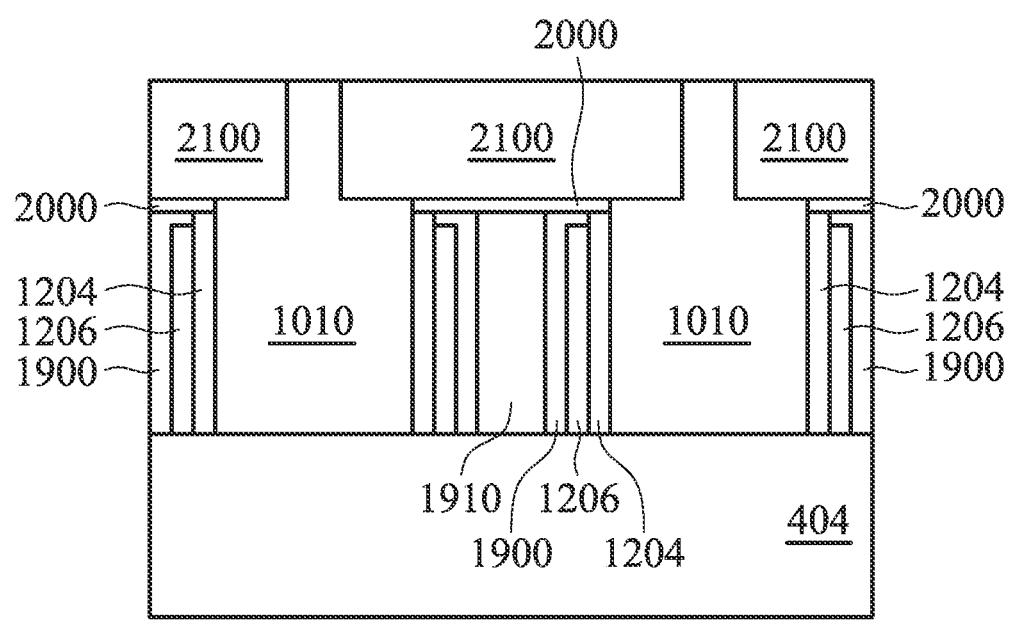

Corresponding to operation 236 of FIG. 2B, FIG. 21 illustrates the formation of a dielectric layer 2100 formed in the trench 1000 above the tungsten layer 2000. The dielectric layer 2100 (e.g., silicon oxide, silicon nitride, a low-k dielectric material, or the like) is formed in the trench 1000, using a suitable formation method such as PVD, CVD, or the like.

According to some embodiments, and as shown in FIG. 21, the formation and etching of the p-metal layer 1206, the gate dielectric layer 1204, and the n-metal layer 1900 may be such that a top portion of the p-metal layer 1206 is below a top portion of the gate dielectric layer 1204, and the n-metal layer 1900. In this case, the gate dielectric layer 1204 may contact sidewalls of a respective of the interlevel dielectric structures 1010, the p-metal layer may contact an inner sidewall of the gate dielectric layer 1204, and the n-metal layer 1900 may contact an inner sidewall of the p-metal layer 1206, wherein a top portion of the n-metal layer 1900 is above a top portion of the p-metal layer 1206. According to some embodiments, the top portion of the n-metal layer 1900 may be directly above a top portion of the p-metal layer 1206.

In one aspect of the present disclosure, a method of manufacturing a semiconductor device is disclosed. The method includes depositing a coating layer on a first region and a second region under a loading condition such that a height of the coating layer in the first region is greater than a height of the coating layer in the second region. A processing gas is applied to the coating layer to remove an upper portion of the coating layer such that a height of the coating layer in the first region is a same as a height of the coating layer in the second region.

In yet another aspect of the present disclosure, a method of making semiconductor device is disclosed. A coating layer is deposited on a first region and a second region under a loading condition such that a first portion in the first region and a second portion in the second region have a height difference. The first region has a first trench with a first upper portion and a first lower portion. The second region has a second trench with a second upper portion and a second lower portion. The first upper portion is wider than the first lower portion and the second upper portion id wider than the second lower portion. A deposition gas and an etch gas are applied to the coating layer to remove an upper portion of the coating layer to reduce the height difference. The coating layer is removed from the first and second upper portions, but not the first and second lower portions.

In yet another aspect of the present disclosure, a method of making semiconductor device is disclosed. A coating layer is deposited on a first region and a second region under a loading condition such that a first portion in the first region and a second portion in the second region have a height difference. The first region has a first trench with a first upper portion and a first lower portion. The second region has a second trench with a second upper portion and a second lower portion. The first upper portion is wider than the first lower portion and the second upper portion id wider than the second lower portion. A deposition gas and an etch gas are applied to the coating layer to remove an upper portion of the coating layer to reduce the height difference.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    depositing a coating layer on a first region and a second region under a loading condition such that a height of the coating layer in the first region is greater than a height of the coating layer in the second region; and
    applying processing gas to the coating layer to remove an upper portion of the coating layer such that a height of the coating layer in the first region is substantially a same as a height of the coating layer in the second region,
    wherein the first region has first structures and first trenches adjacent the first structures, the first trenches having a first upper portion and a first lower portion, the first upper portion being wider than the first lower portion, wherein the second region has second structures and second trenches adjacent the second structures, the second trenches having a second upper portion and a second lower portion, the second upper portion being wider than the second lower portion.

2. The method of claim 1, wherein the first region has a density of structures, the structures separated by trenches, greater than that of the second region.

3. The method of claim 2, wherein the loading condition is based on a difference in the density of structures.

4. The method of claim 1, wherein the coating layer includes one of a photoresist or a bottom anti-reflecting coating.

5. The method of claim 1, wherein the processing gas includes a deposition gas.

6. The method of claim 5, wherein the processing gas includes an etch gas.

7. The method of claim 6, wherein the etch gas includes $NH_3$.

8. The method of claim 1, wherein the first region has first interlevel dielectric structures, and the second region has second interlevel dielectric structures, and the first interlevel dielectric structures have the first trenches between adjacent of the first interlevel dielectric structures, and the second interlevel dielectric structures have the second trenches between adjacent of the second interlevel dielectric structures.

9. The method of claim 8, further comprising:
forming a high-k dielectric layer on the interlevel dielectric structures and forming a working function metal on the high-k dielectric layer.

10. The method of claim 1, further comprising conformally etching the coating layer to remove the coating layer from the first and second upper portions such that the coating layer has substantially a same height in the first and second regions, and leaving the coating layer in the first and second lower portions.

11. The method of claim 10, further comprising performing a wet pull back etch of gate dielectric and work function metal structures which are adjacent to the first and second upper portions.

12. The method of claim 11, further comprising removing the coating layer that remains in the first and second lower portions following conformally etching the coating layer, wherein such removal is performed after performing the wet pull back etch.

13. The method of claim 12, wherein the removing the coating layer that remains in the first and second lower portions includes ashing the coating layer.

14. The method of claim 1, further comprising removing the coating layer that remains after the step of applying processing gas to the coating layer.

15. The method of claim 14, further comprising forming a metal gate layer in trenches in the first and second regions.

16. A method of fabricating a semiconductor device, comprising:
depositing a coating layer on a first region and a second region under a loading condition such that a first portion in the first region and a second portion in the second region have a height difference, the first region having a first trench with a first upper portion and a first lower portion, the second region having a second trench with a second upper portion and a second lower portion, the first upper portion being wider than the first lower portion, the second upper portion being wider than the second lower portion; and
applying a deposition gas and an etch gas to the coating layer to remove an upper portion of the coating layer to reduce the height difference, and the coating layer is removed from the first and second upper portions, but not the first and second lower portions.

17. The method of claim 16, wherein the deposition gas includes at least one of He, $CH_4$ or $H_2$ and the etch gas includes $NH_3$.

18. The method of claim 16, wherein the etch gas includes $NH_3$.

19. A method of fabricating a semiconductor device, comprising:
depositing a coating layer on a first region and a second region under a loading condition such that a first portion in the first region and a second portion in the second region have a height difference, the first region having a first trench with a first upper portion and a first lower portion, the second region having a second trench with a second upper portion and a second lower portion, the first upper portion being wider than the first lower portion, the second upper portion being wider than the second lower portion; and
applying a deposition gas and an etch gas to the coating layer to remove an upper portion of the coating layer to reduce the height difference.

20. The method of claim 19, wherein the deposition gas includes at least one of He, $CH_4$ or $H_2$ and the etch gas includes $NH_3$.

* * * * *